(12) United States Patent
Zhang et al.

(10) Patent No.: US 10,280,486 B2
(45) Date of Patent: *May 7, 2019

(54) NICKEL-BASED SUPERALLOY AND ARTICLES

(71) Applicant: General Electric Company, Schenectady, NY (US)

(72) Inventors: Wei-Jun Zhang, Mason, OH (US); Douglas Gerard Konitzer, West Chester, OH (US); Joshua Leigh Miller, West Chester, OH (US)

(73) Assignee: General Electric Company, Schenectady, NY (US)

( * ) Notice: Subject to any disclaimer, the term of this patent is extended or adjusted under 35 U.S.C. 154(b) by 611 days.

This patent is subject to a terminal disclaimer.

(21) Appl. No.: 14/482,811

(22) Filed: Sep. 10, 2014

(65) Prior Publication Data

US 2014/0377125 A1    Dec. 25, 2014

Related U.S. Application Data

(62) Division of application No. 13/665,280, filed on Oct. 31, 2012, now Pat. No. 8,858,876.

(51) Int. Cl.
    *C22C 19/05*  (2006.01)
    *C30B 11/00*  (2006.01)
    (Continued)

(52) U.S. Cl.
    CPC ............ *C22C 19/057* (2013.01); *C30B 11/00* (2013.01); *C30B 29/52* (2013.01); *F01D 5/28* (2013.01); *F05C 2201/0466* (2013.01)

(58) Field of Classification Search
    CPC .................................. C22F 1/10; C22C 19/057
    See application file for complete search history.

(56) References Cited

U.S. PATENT DOCUMENTS

| 4,643,782 A | 2/1987 | Harris et al. |
| 4,719,080 A | 1/1988 | Duhl et al. |

(Continued)

FOREIGN PATENT DOCUMENTS

| EP | 0687741 A1 | 12/1995 |
| EP | 0962542 | 12/1999 |

(Continued)

OTHER PUBLICATIONS

PCT Search Report and Written Opinion dated Jan. 31, 2014, issued in connection with corresponding WO Patent Application No. PCT/US2013/062980.

*Primary Examiner* — Jessee R Roe
(74) *Attorney, Agent, or Firm* — General Electric Company; Kristi L. Davidson

(57) ABSTRACT

A nickel-based superalloy composition includes from about 5 to about 7 wt % aluminum, from about 4 to about 8 wt % tantalum, from about 3 to about 8 wt % chromium, from about 3 to about 7 wt % tungsten, from 1 to about 5 wt % molybdenum, from 1.5 to about 5 wt % rhenium, from 5 to about 14 wt % cobalt, from about 0 to about 1 wt % hafnium, from about 0.01 to about 0.03 wt % carbon, from about 0.002 to about 0.006 wt % boron, and balance nickel and incidental impurities. The composition may exhibit a sustained peak low cycle fatigue life at 1800° F./45 ksi of at least about 4000 cycles. The nickel-based superalloy composition may be used in single-crystal or directionally solidified superalloy articles, such as a blade, nozzle, a shroud, a splash plate, and a combustor of a gas turbine engine.

22 Claims, 5 Drawing Sheets

(51) Int. Cl.
*C30B 29/52* (2006.01)
*F01D 5/28* (2006.01)

(56) References Cited

U.S. PATENT DOCUMENTS

| | | | |
|---|---|---|---|
| 5,151,249 A | 9/1992 | Austin et al. | |
| 5,240,518 A | 8/1993 | Wrotman et al. | |
| 5,270,123 A | 12/1993 | Walston et al. | |
| 5,366,695 A | 11/1994 | Erickson | |
| 5,455,120 A | 10/1995 | Walston et al. | |
| 5,482,789 A | 1/1996 | O'Hara et al. | |
| 5,549,765 A | 8/1996 | Mihalisin et al. | |
| 5,660,649 A | 8/1997 | Bornstein et al. | |
| 6,007,645 A | 12/1999 | Cetel et al. | |
| 6,051,083 A | 4/2000 | Tamaki et al. | |
| 6,054,096 A | 4/2000 | Duhl et al. | |
| 6,074,602 A | 6/2000 | Wukusick et al. | |
| 6,419,763 B1 | 7/2002 | Konter et al. | |
| 6,444,057 B1 | 9/2002 | Darolia et al. | |
| 6,966,956 B2 | 11/2005 | Koizumi et al. | |
| 7,115,175 B2 | 10/2006 | DeLuca et al. | |
| 8,858,876 B2 * | 10/2014 | Zhang | C22C 19/057 420/445 |
| 2001/0026769 A1 | 10/2001 | Kobayashi et al. | |
| 2003/0075247 A1 | 4/2003 | Koizumi et al. | |
| 2004/0213693 A1 | 10/2004 | Corrigan et al. | |
| 2004/0229072 A1 | 11/2004 | Murphy | |
| 2006/0207693 A1 | 9/2006 | DeLuca et al. | |
| 2007/0059550 A1 | 3/2007 | Jones et al. | |
| 2009/0185944 A1 | 7/2009 | Hu | |
| 2010/0135846 A1 | 6/2010 | Cetel et al. | |
| 2010/0254822 A1 | 10/2010 | Hazel et al. | |
| 2011/0076179 A1 | 3/2011 | O'Hara et al. | |
| 2011/0120597 A1 | 5/2011 | O'Hara et al. | |

FOREIGN PATENT DOCUMENTS

| | | |
|---|---|---|
| EP | 1571297 | 9/2005 |
| EP | 2377683 A2 | 10/2011 |
| GB | 2235697 A | 3/1991 |
| WO | 03025237 A1 | 3/2003 |
| WO | 2009032578 A1 | 3/2009 |

* cited by examiner

| ALLOY | Al | Ta | Cr | W | Mo | Re | Co | Ti | Ru | Hf | C | B | Ni | SPLCF (1800F/ 45 ksi) | Rupture (2000F/ 20 ksi) |
|---|---|---|---|---|---|---|---|---|---|---|---|---|---|---|---|
| A1 | 6.4 | 5.5 | 6.0 | 4.0 | 2.0 | 4 | 7.5 | – | – | 0.20 | 0.02 | 0.004 | Bal. | 4111 | 155 |
| A2 | 6 | 8 | 6.0 | 5.0 | 2.5 | 4 | 10 | – | 2 | 0.20 | 0.02 | 0.004 | Bal. | 2234 | 28 |
| A3 | 6.4 | 5.5 | 8.5 | 3.5 | 0.5 | 4 | 7.5 | – | – | 0.20 | 0.02 | 0.004 | Bal. | 2857 | 67 |
| A4 | 6.1 | 4.5 | 6.0 | 5.0 | 2.0 | 4 | 5 | – | – | 0.20 | 0.02 | 0.004 | Bal. | 3031 | 129 |
| A5 | 6 | 6.5 | 4.5 | 5.0 | 2.5 | 4 | 12 | – | – | 0.20 | 0.02 | 0.004 | Bal. | 5497 | 203 |
| A6 | 5.8 | 7 | 4.5 | 6.0 | 2.5 | 3.5 | 10 | – | – | 0.20 | 0.02 | 0.004 | Bal. | 5219 | 211 |
| R1 | 6.2 | 6.5 | 7 | 5 | 1.5 | 3 | 7.5 | – | – | 0.15 | 0.05 | 0.004 | Bal. | 2546 | 85 |
| R2 | 6 | 6 | 2.0 | 12.5 | 1.0 | 3 | 13 | – | – | 0.15 | 0.02 | 0.004 | Bal. | 2880 | 50 |
| R3 | 6 | 6 | 2.0 | 12.5 | 1.0 | 3 | 13 | – | 3 | 0.10 | 0.02 | 0.004 | Bal. | 2402 | 65 |
| R4 | 5.7 | 8 | 2.0 | 5.0 | 0.4 | 6 | 3 | 0.2 | – | 0.03 | 0.02 | 0.004 | Bal. | 3595 | 114 |
| R5 | 5.55 | 8.25 | 2.0 | 6.0 | 2.0 | 6 | 17 | – | 3 | 0.15 | 0.03 | 0.004 | Bal. | 3750 | 146 |

FIG. 2

NICKEL-BASED SUPERALLOY AND ARTICLES

CROSS REFERENCE TO RELATED APPLICATIONS

This is a division patent application of U.S. patent application Ser. No. 13/665,280, now U.S. Pat. No. 8,858,876, filed Oct. 31, 2012, the contents of which are incorporated herein by reference.

BACKGROUND OF THE INVENTION

This invention relates generally to compositions of matter suitable for use in aggressive, high-temperature gas turbine environments, and articles made therefrom.

Nickel-based single crystal superalloys are used extensively throughout the aeroengine in turbine blade, nozzle, and shroud applications. Aeroengine designs for improved engine performance demand alloys with increasingly higher temperature capability, primarily in the form of improved creep strength (creep resistance). Alloys with increased amounts of solid solution strengthening elements such as Ta, W, Re, and Mo, which also provide improved creep resistance, generally exhibit decreased phase stability, increased density, and lower environmental resistance. Recently, thermal-mechanical fatigue (TMF) resistance has been a limiting design criterion for turbine components. Temperature gradients create cyclic thermally induced strains that promote damage by a complex combination of creep, fatigue, and oxidation. Directionally solidified superalloys have not historically been developed for cyclic damage resistance. However, increased cyclic damage resistance is desired for improved engine efficiency.

Single crystal superalloys may be classified into four generations based on similarities in alloy compositions and high temperature mechanical properties. So-called first generation single crystal superalloys contain no rhenium. Second generation superalloys typically contain about three weight percent rhenium. Third generation superalloys are designed to increase the temperature capability and creep resistance by raising the refractory metal content and lowering the chromium level. Exemplary alloys have rhenium levels of about 5.5 weight percent and chromium levels in the 2-4 weight percent range. Fourth and fifth generation alloys include increased levels of rhenium and other refractory metals, such as ruthenium.

Second generation alloys are not exceptionally strong, although they have relatively stable microstructures. Third and fourth generation alloys have improved strength due to the addition of high levels of refractory metals. For example, these alloys include high levels of tungsten, rhenium, and ruthenium. These refractory metals have densities that are much higher than that of the nickel base, so their addition increases the overall alloy density. For example, fourth generation alloys may be about 6% heavier than second generation alloys. The increased weight and cost of these alloys limit their use to only specialized applications. Third and fourth generation alloys are also limited by microstructural instabilities, which can impact long-term mechanical properties.

Each subsequent generation of alloys was developed in an effort to improve the creep strength and temperature capability of the prior generation. For example, third generation superalloys provide a 50° F. (about 28° C.) improvement in creep capability relative to second generation superalloys. Fourth and fifth generation superalloys offer a further improvement in creep strength achieved by high levels of solid solution strengthening elements such as rhenium, tungsten, tantalum, molybdenum and the addition of ruthenium.

As the creep capability of directionally solidified superalloys has improved over the generations, the continuous-cycle fatigue resistance and the hold-time cyclic damage resistance have also improved. These improvements in rupture and fatigue strength have been accompanied by an increase in alloy density and cost, as noted above. In addition, there is a microstructural and environmental penalty for continuing to increase the amount of refractory elements in directionally solidified superalloys. For example, third generation superalloys are less stable with respect to topological close-packed phases (TCP) and tend to form a secondary reaction zone (SRZ). The lower levels of chromium, necessary to maintain sufficient microstructural stability, results in decreased environmental resistance in the subsequent generations of superalloys.

Cyclic damage resistance is quantified by hold time or sustained-peak low cycle fatigue (SPLCF) testing, which is an important property requirement for single crystal turbine blade alloys. The third and fourth generation single crystal superalloys have the disadvantages of high density, high cost due to the presence of rhenium and ruthenium, microstructural instability under coated condition (SRZ formation), and inadequate SPLCF lives.

Accordingly, it is desirable to provide single crystal superalloy compositions that contain less rhenium and ruthenium, have longer SPLCF lives, and have improved microstructural stability through less SRZ formation, while maintaining adequate creep and oxidation resistance.

BRIEF DESCRIPTION OF THE INVENTION

Fatigue resistant nickel-based single crystal superalloys for turbine blade applications that provide lower density, low rhenium and ruthenium content, low cost, improved SPLCF resistance, and less SRZ formation compared to known alloys as well as balanced creep and oxidation resistance are described in various exemplary embodiments.

According to an exemplary embodiment, a composition of matter comprises from about 5 to about 7 wt % aluminum, from about 4 to about 8 wt % tantalum, from about 3 to about 8 wt % chromium, from about 3 to about 7 wt % tungsten, from 1 to about 5 wt % molybdenum, from 1.5 to about 5 wt % rhenium, from 5 to about 14 wt % cobalt, from about 0 to about 1 wt % hafnium, from about 0.01 to about 0.03 wt % carbon, from about 0.002 to about 0.006 wt % boron, and balance nickel and incidental impurities. According to embodiments of the invention, the composition may exhibit a sustained peak low cycle fatigue life at 1800° F./45 ksi of at least about 4000 cycles.

Exemplary embodiments disclosed herein include an article, such as a blade, nozzle, a shroud, a splash plate, and a combustor of a gas turbine engine, comprising a substantially single crystal having a composition comprising from about 5 to about 7 wt % aluminum, from about 4 to about 8 wt % tantalum, from about 3 to about 8 wt % chromium, from about 3 to about 7 wt % tungsten, from 1 to about 5 wt % molybdenum, from 1.5 to about 5 wt % rhenium, from 5 to about 14 wt % cobalt, from about 0 to about 1 wt % hafnium, from about 0.01 to about 0.03 wt % carbon, from about 0.002 to about 0.006 wt % boron, and balance nickel and incidental impurities. According to embodiments of the invention, the composition may exhibit a sustained peak low cycle fatigue life at 1800° F./45 ksi of at least about 4000 cycles.

BRIEF DESCRIPTION OF THE DRAWINGS

The subject matter which is regarded as the invention is particularly pointed out and distinctly claimed in the concluding part of the specification. The invention, however, may be best understood by reference to the following description taken in conjunction with the accompanying drawing figures in which:

FIG. 2 is a table setting forth exemplary compositions according to the invention and reference compositions.

DETAILED DESCRIPTION OF THE INVENTION

This invention describes the chemistries of Ni-based single crystal superalloys for turbine blade applications. The superalloys provide lower density, low rhenium and ruthenium content, low cost, improved SPLCF resistance, and less SRZ formation compared to known alloys, as well as balanced creep and oxidation resistance. The improvement of fatigue resistance was achieved by balancing the strength, oxidation and creep resistance of the alloys through controlling the amount of gamma strengtheners such as W, Mo, Re, Co and Cr and by controlling the volume fraction of gamma prime phase by controlling the concentration of Al, Ta, Hf. The invention is described in various exemplary embodiments.

Figure 1:
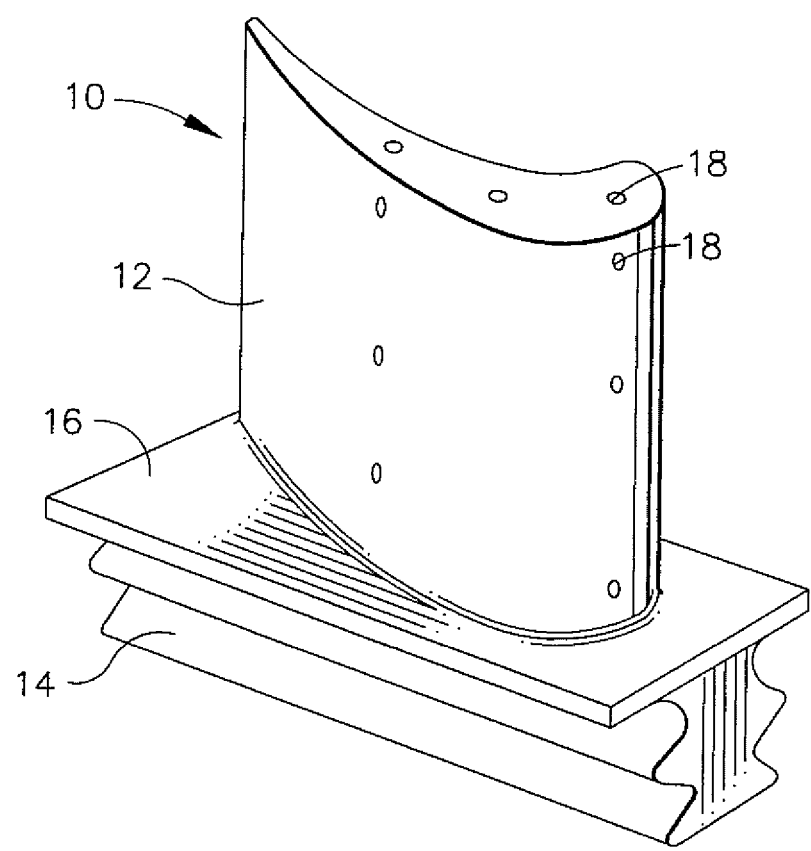
FIG. 1 is a perspective view of an article, such as a gas turbine blade, according to an embodiment of the invention.

Referring to the drawings, FIG. 1 depicts a component of a gas turbine engine, illustrated as a gas turbine blade 10. The gas turbine blade 10 includes an airfoil 12, a laterally extending platform 16, an attachment 14 in the form of a dovetail to attach the gas turbine blade 10 to a turbine disk (not shown). In some components, a number of cooling channels extend through the interior of the airfoil 12, ending in openings 18 in the surface of the airfoil 12.

In an exemplary embodiment, the component article 10 is substantially a single crystal. That is, the component article 10 is at least about 80 percent by volume, and more preferably at least about 95 percent by volume, a single grain with a single crystallographic orientation. There may be minor volume fractions of other crystallographic orientations and also regions separated by low-angle boundaries. The single-crystal structure is prepared by the directional solidification of an alloy composition, usually from a seed or other structure that induces the growth of the single crystal and single grain orientation.

The use of exemplary alloy compositions discussed herein is not limited to the gas turbine blade 10, and it may be employed in other articles such as gas turbine nozzles, vanes, shrouds, or other components for gas turbine engines.

It is believed that the exemplary embodiments disclosed herein provide a unique alloying approach for improved SPLCF and rupture resistant alloys. Table I below provides exemplary concentration ranges in weight percent for the elements included in the alloy of the invention. All amounts provided as ranges, for each element, should be construed to include endpoints and sub-ranges.

TABLE I

| Exemplary Concentration Ranges | | | | | | | | | | | |
|---|---|---|---|---|---|---|---|---|---|---|---|
| Alloy | Al | Ta | Cr | W | Mo | Re | Co | Hf | C | B | Ni |
| Min. wt % | 5 | 4 | 3 | 3 | 1 | 1.5 | 5 | 0 | 0.01 | 0.002 | Bal. |
| Max. wt % | 7 | 8 | 8 | 7 | 5 | 5 | 14 | 1 | 0.03 | 0.006 | Bal. |

Exemplary embodiments disclosed herein may include aluminum to provide improved SPLCF resistance and oxidation resistance. Exemplary embodiments may include from about 5 to about 7 wt % aluminum. Other exemplary embodiments may include from about 5.5 to about 6.5 wt % aluminum. Other exemplary embodiments may include from about 5.5 to about 6.2 wt % aluminum. Other exemplary embodiments may include from about 6.1 to about 6.5 wt % aluminum. Other exemplary embodiments may include from about 6.2 to about 6.4 wt % aluminum.

Exemplary embodiments disclosed herein may include tantalum to promote gamma prime strength. Exemplary embodiments may include from about 4 to about 8 wt % tantalum. Other exemplary embodiments may include from about 4.5 to about 8 wt % tantalum. Other exemplary embodiments may include from about 6 to about 8 wt % tantalum. Other exemplary embodiments may include from about 4 to about 6 wt % tantalum.

Exemplary embodiments disclosed herein may include chromium to improve hot corrosion resistance. Exemplary embodiments may include from about 3 to about 8 wt % chromium. Other exemplary embodiments may include from about 4 to about 6.5 wt % chromium. Other exemplary embodiments may include from about 4.3 to about 6.5 wt % chromium. Other exemplary embodiments disclosed herein may include from about 4.5 to about 5 wt % chromium. Other exemplary embodiments may include from about 5 to about 6.5 wt % chromium. Other exemplary embodiments disclosed herein may include from about 5.5 to about 6 wt % chromium.

Exemplary embodiments disclosed herein may include tungsten as a strengthener. Exemplary embodiments may include from about 3 to about 7 wt % tungsten. Other exemplary embodiments may include tungsten in amounts from about 3 to about 6 wt %. Other exemplary embodiments may include tungsten in amounts from about 4 to about 6 wt %. Other exemplary embodiments may include tungsten in amounts from about 3.5 to about 6.5 wt %. Other exemplary embodiments may include tungsten in amounts from about 3.5 to about 6 wt %.

Exemplary embodiments disclosed herein may include molybdenum to impart solid solution strengthening. Exemplary embodiments may include from about 1 to about 5 wt % molybdenum. Other exemplary embodiments may include molybdenum in amounts from about 2 to about 5 wt %. Other exemplary embodiments may include molybdenum in amounts from about 2 to about 4 wt %. Other exemplary embodiments may include molybdenum in amounts from about 2 to about 3 wt %. Other exemplary embodiments may include molybdenum in amounts from about 1.5 to about 4 wt %. Other exemplary embodiments may include molybdenum in amounts from about 1.5 to about 2.5 wt %.

Exemplary embodiments disclosed herein may include rhenium, which is a potent solid solution strengthener that partitions to the gamma phase, and also is a slow diffusing element, which limits coarsening of the gamma prime. Exemplary embodiments may include from about 1.5 to about 5 wt % rhenium. Other exemplary embodiments may include rhenium at levels between about 2.5 to about 4.5 wt %. Other exemplary embodiments may include rhenium at levels between about 3 to about 4.2 wt %. Other exemplary embodiments may include rhenium at levels between about 3 to about 4 wt %. Other exemplary embodiments may include rhenium at levels between about 2.5 to about 4.5 wt %. Other exemplary embodiments may include rhenium at levels between about 3.5 to about 4.2 wt %.

Exemplary embodiments disclosed herein may include cobalt. Exemplary embodiments may include from about 5 to about 14 wt % cobalt. Other exemplary embodiments may include from about 7 to about 12.5 wt % cobalt. Other exemplary embodiments may include from about 9 to about 12 wt % cobalt. Other exemplary embodiments may include from about 5 to about 8 wt % cobalt. Other exemplary embodiments may include from about 6.5 to about 7.5 wt % cobalt.

Exemplary embodiments disclosed herein may optionally include hafnium, which improves the oxidation and hot corrosion resistance of coated alloys. Hafnium may improve the life of thermal barrier coatings. Exemplary embodiments may include from about 0 to about 1 wt % hafnium. Other exemplary embodiments may include from about 0.2 to about 0.6 wt % hafnium.

Exemplary embodiments disclosed herein may include carbon. Exemplary embodiments may include from about 0.01 to about 0.03 wt % carbon. Other exemplary embodiments may include from about 0.015 to about 0.025 wt % carbon. Other exemplary embodiments may include from about 0.015 to about 0.025 wt % carbon.

Exemplary embodiments disclosed herein may include boron to provide tolerance for low angle boundaries. Exemplary embodiments may include from about 0.002 to about 0.006 wt % boron. Other exemplary embodiments may include from about 0.0025 to about 0.0055 wt % boron. Other exemplary embodiments may include from about 0.003 to about 0.005 wt % boron. Other exemplary embodiments may include from about 0.0035 to about 0.0045% boron.

According to an exemplary embodiment, a composition of matter comprises from about 5 to about 7 wt % aluminum, from about 4 to about 8 wt % tantalum, from about 3 to about 8 wt % chromium, from about 3 to about 7 wt % tungsten, from 1 to about 5 wt % molybdenum, from 1.5 to about 5 wt % rhenium, from 5 to about 14 wt % cobalt, from about 0 to about 1 wt % hafnium, from about 0.01 to about 0.03 wt % carbon, from about 0.002 to about 0.006 wt % boron, and balance nickel and incidental impurities.

In another embodiment, a composition of matter comprises from about 5.5 to about 6.5 wt % aluminum, from about 4.5 to about 8 wt % tantalum, from about 4 to about 6.5 wt % chromium, from about 3 to about 6 wt % tungsten, from 2 to about 5 wt % molybdenum, from 2.5 to about 4.5 wt % rhenium, from 7 to about 12.5 wt % cobalt, from about 0.2 to about 0.6 wt % hafnium, from about 0.015 to about 0.025 wt % carbon, from about 0.0025 to about 0.0055 wt % boron, and balance nickel and incidental impurities.

In yet another embodiment, a composition of matter comprises from about 5.5 to about 6.5 wt % aluminum, from about 6 to about 8 wt % tantalum, from about 4.3 to about 6.5 wt % chromium, from about 4 to about 6 wt % tungsten, from 2 to about 4 wt % molybdenum, from 3 to about 4.2 wt % rhenium, from 7 to about 12.5 wt % cobalt, from about 0.2 to about 0.6 wt % hafnium, from about 0.015 to about 0.025 wt % carbon, from about 0.003 to about 0.005 wt % boron, and balance nickel and incidental impurities.

In another embodiment, a composition of matter comprises from about 5.5 to about 6.2 wt % aluminum, from about 6 to about 8 wt % tantalum, from about 4.5 to about 5 wt % chromium, from about 4 to about 6 wt % tungsten, from 2 to about 3 wt % molybdenum, from 3 to about 4 wt % rhenium, from 9 to about 12.0 wt % cobalt, from about 0.2 to about 0.6 wt % hafnium, from about 0.015 to about 0.025 wt % carbon, from about 0.0035 to about 0.0045 wt % boron, and balance nickel and incidental impurities.

In yet another embodiment, a composition of matter comprises from about 6.1 to about 6.5 wt % aluminum, from about 4 to about 6 wt % tantalum, from about 5 to about 6.5 wt % chromium, from about 3.5 to about 6.5 wt % tungsten, from 1.5 to about 4 wt % molybdenum, from 2.5 to about 4.5 wt % rhenium, from 5 to about 8 wt % cobalt, from about 0.2 to about 0.6 wt % hafnium, from about 0.015 to about 0.025 wt % carbon, from about 0.003 to about 0.005 wt % boron, and balance nickel and incidental impurities.

In another embodiment, a composition of matter comprises from about 6.2 to about 6.4 wt % aluminum, from about 4 to about 6 wt % tantalum, from about 5.5 to about 6 wt % chromium, from about 3.5 to about 6 wt % tungsten, from 1.5 to about 2.5 wt % molybdenum, from 3.5 to about 4.2 wt % rhenium, from 6.5 to about 7.5 wt % cobalt, from about 0.2 to about 0.6 wt % hafnium, from about 0.015 to about 0.025 wt % carbon, from about 0.0035 to about 0.0045 wt % boron, and balance nickel and incidental impurities.

Exemplary embodiments disclosed herein include an article, such as a blade, nozzle, a shroud, a splash plate, and a combustor of a gas turbine engine, comprising a substantially single crystal having a composition comprising from about 5 to about 7 wt % aluminum, from about 4 to about 8 wt % tantalum, from about 3 to about 8 wt % chromium, from about 3 to about 7 wt % tungsten, from 1 to about 5 wt % molybdenum, from 1.5 to about 5 wt % rhenium, from 5 to about 14 wt % cobalt, from about 0 to about 1 wt % hafnium, from about 0.01 to about 0.03 wt % carbon, from about 0.002 to about 0.006 wt % boron, and balance nickel and incidental impurities.

Exemplary compositions according to the invention and reference compositions are presented in the FIG. 2. As indicated in FIG. 2, alloys A1-A6 have compositions according to the invention. Reference alloys R1-R5 have compositions that fall outside of the compositional ranges according to the invention, as described above. FIG. 2 also provides the sustained-peak low cycle fatigue resistance (SPLCF) (cycles) at 1800° F./45 ksi and rupture life at 2000° F./20 ksi (hours) for alloys A1-A6 as well as reference alloys R1-R5.

The SPLCF testing was performed by applying strain controlled, compressive hold for 2 minutes at 1800° F. with an alternate pseudo stress of 45 ksi.

As indicated in FIG. 2, the alloys A1, A5, and A6 have SPLCF and rupture tolerances greater than reference alloys R1-R5. In general, the alloys according to an embodiment of the invention exhibit a SPLCF greater than about 4000 cycles at 1800° F./45 ksi and a rupture of greater than about 150 hours at 2000° F./20 ksi. Specifically, alloy A1 has a SPLCF of about 4111 cycles and a rupture life of about 155 hours. Further, the alloys according to another embodiment of the invention generally exhibit a SPLCF greater than about 5000 cycles at 1800° F./45 ksi and a rupture life of greater than about 200 hours at 2000° F./20 ksi. In particular, A5 has a SPLCF of about 5497 cycles and a rupture life of about 203 hours, and alloy A6 has a SPLCF of about 5219 cycles and a rupture life of about 211 hours.

Figure 3:
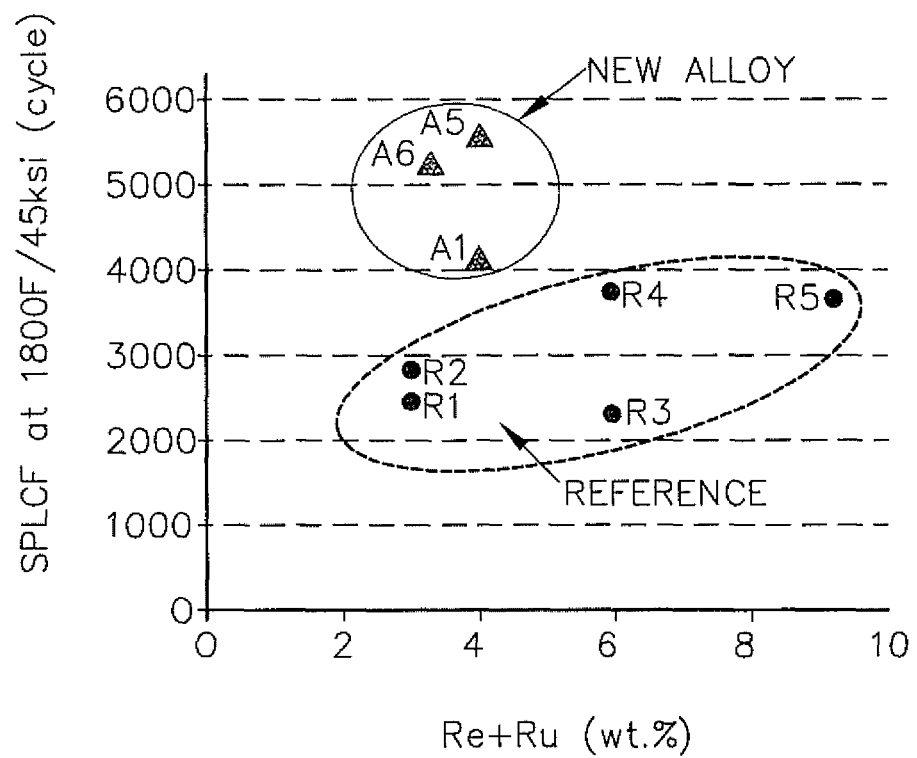
FIG. 3 is a graph showing sustained peak low cycle fatigue life (SPLCF) (cycles) at 1800° F./45 ksi as a function of total Re and Ru concentration (wt %) for exemplary compositions according to the invention and reference compositions.
Figure 4:
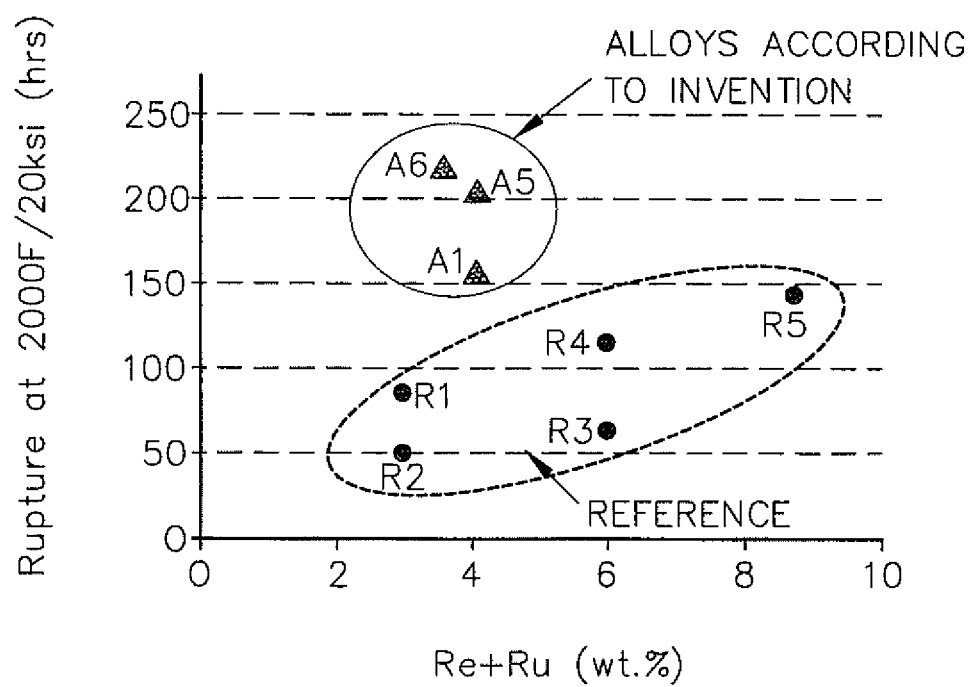
FIG. 4 is a graph showing rupture tolerance (hours) at 2000° F./20 ksi as a function of total Re and Ru concentration (wt %) for exemplary compositions according to the invention and reference compositions.

FIG. 3 is a graph showing SPLCF life (cycles) at 1800° F./45 ksi as a function of total Re and Ru concentration (wt %) for exemplary compositions according to the invention and reference compositions. FIG. 4 is a graph showing rupture life (hours) at 2000° F./20 ksi as a function of total Re and Ru concentration (wt %) for exemplary compositions according to the invention and reference compositions.

As indicated in FIGS. 3 and 4, alloys A1, A5, and A6 according to the invention have much higher SPLCF and rupture lives than the reference alloys R1-R5 with similar or higher Re+Ru concentrations. In particular, alloys A1 and A5 have a Re+Ru concentration of about 4 wt %, and alloy A6 has a Re+Ru concentration of about 3.5 wt %. Reference alloys R3-R5 have higher Re+Ru concentrations than alloys A1, A5, and A6, but exhibit lower SPLCF and rupture lives than alloys A1, A5, and A6.

The data summarized in FIGS. 2-4 indicates that the exemplary embodiments disclosed herein demonstrate an improved combination of fatigue and creep resistance than known alloys. In addition, an advantage of the alloys of the invention is that their relatively low total concentration of rhenium and ruthenium, as compared to some of the reference alloys, significantly reduces the cost of the alloys.

The exemplary embodiments describe the compositions and some characteristics of the alloys, but should not be interpreted as limiting the invention in any respect.

Figure 5:
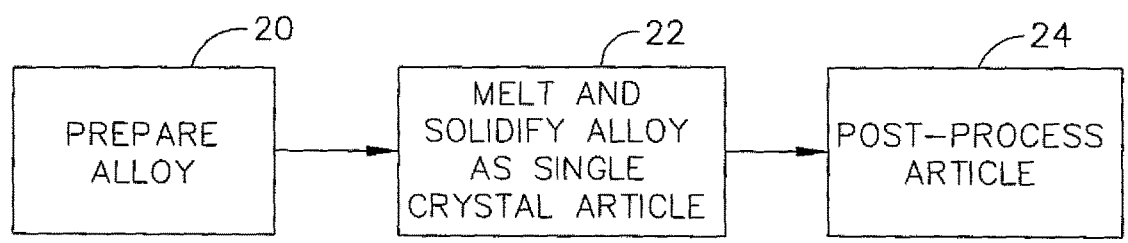
FIG. 5 is a block-flow diagram illustrating an approach for preparing an article according to the invention.

FIG. 5 is a block-flow diagram illustrating an approach for preparing an article according to the invention. An alloy having the composition set forth above is prepared, as shown at reference numeral 20. The alloy is melted and solidified as substantially a single crystal, as shown at reference numeral 22. Techniques for solidifying single crystal articles are well-known in the art. Generally, they involve solidifying the alloy in a mold unidirectionally from one end of the article, with a seed or growth constriction defining the single crystal orientation that is desired in the article. In most cases, the article is prepared with a [001] crystallographic direction parallel to a long axis of the article in the case of the turbine blade or turbine vane. After solidification as a single crystal, the article is post processed by any operable technique, as shown at reference numeral 24. Post processing may include, but is not limited to heat treating the article to optimize the mechanical properties of the alloy and/or machining the article.

This written description uses exemplary embodiments to disclose the invention, including the best mode, and also to enable any person skilled in the art to make and use the invention. The patentable scope of the invention is defined by the claims, and may include other exemplary embodiments that occur to those skilled in the art. Such other exemplary embodiments are intended to be within the scope of the claims if they have structural elements that do not differ from the literal language of the claims, or if they include equivalent structural elements with insubstantial differences from the literal languages of the claims.

What is claimed is:

1. A composition of matter, comprising:
from about 5 to about 7 wt % aluminum;
from about 5.5 to about 8 wt % tantalum;
about 4.3 wt % chromium;
from about 3.5 to about 7 wt % tungsten;
from 1.5 to about 2.5 wt % molybdenum;
from 3 to about 4 wt % rhenium;
from 9 to about 12 wt % cobalt;
from about 0.2 to about 0.6 wt % hafnium;
from about 0.01 to about 0.03 wt % carbon;
from about 0.002 to about 0.006 wt % boron; and
balance nickel and incidental impurities,
wherein the composition exhibits a sustained peak low cycle fatigue life at 1800° F./45 ksi of at least 4000 cycles.

2. The composition of matter of claim 1, wherein the composition of matter comprises from about 6 to about 8.0 wt % tantalum, from about 4.0 to about 6.0 wt % tungsten, from about 2.0 to about 2.5 wt % molybdenum, and from about 3.5 to 4.0 wt % rhenium.

3. The composition of matter of claim 1, wherein the composition of matter comprises from about 6.5 to about 8 wt % tantalum and from about 5 to about 6 wt % tungsten.

4. The composition of matter of claim 1, wherein the composition of matter does not comprise ruthenium.

5. The composition of matter of claim 1, wherein the composition of matter comprises a combined total content of tantalum, molybdenum, and rhenium of less than 14.5 wt %.

6. An article comprising the composition of matter of claim 1.

7. The composition of matter of claim 1, wherein the composition exhibits a sustained peak low cycle fatigue life at 1800° F./45 ksi of at least 5000 cycles.

8. The composition of matter of claim 1, wherein the composition exhibits a rupture life at 2000° F./20 ksi of at least 150 hours.

9. The composition of matter of claim 1, wherein the composition exhibits a rupture life at 2000° F./20 ksi of at least 200 hours.

10. An article comprising a composition comprising:
from about 5 to about 7 wt % aluminum;
from about 5.5 to about 8 wt % tantalum;
about 4.3 wt % chromium;
from about 3.5 to about 7 wt % tungsten;
from 1.5 to about 2.5 wt % molybdenum;
from 3 to about 4 wt % rhenium;
from 9 to about 12 wt % cobalt;
from about 0.2 to about 0.6 wt % hafnium;
from about 0.01 to about 0.03 wt % carbon;
from about 0.002 to about 0.006 wt % boron; and
balance nickel and incidental impurities,
wherein the composition exhibits a sustained peak low cycle fatigue life at 1800° F./45 ksi of at least 4000 cycles.

11. The article of claim 10, wherein the article comprises a component of a gas turbine engine selected from a nozzle, a shroud, a splash plate, and a combustor component.

12. The article of claim 10, wherein the article comprises a directionally solidified component.

13. The article of claim 10, wherein the article comprises a single-crystal component.

14. The article of claim 13, wherein the single-crystal component comprises a blade of a gas turbine.

15. The article of claim 12, wherein the directionally solidified component comprises a blade of a gas turbine.

16. A composition of matter, consisting of:
from about 5 to about 7 wt % aluminum;
from about 5.5 to about 8 wt % tantalum;
about 4.3 wt % chromium;
from about 3.5 to about 7 wt % tungsten;

from 1.5 to about 2.5 wt % molybdenum;
from 3 to about 4 wt % rhenium;
from 9 to about 12 wt % cobalt;
from about 0.2 to about 0.6 wt % hafnium;
from about 0.01 to about 0.03 wt % carbon;
from about 0.002 to about 0.006 wt % boron; and
balance nickel and incidental impurities,
wherein the composition exhibits a sustained peak low cycle fatigue life at 1800° F./45 ksi of at least 4000 cycles.

17. The composition of matter of claim 16, wherein the composition of matter consists of:
from about 5 to about 7 wt % aluminum;
from about 6.0 to about 8 wt % tantalum;
about 4.3 wt % chromium;
from about 4.0 to about 7 wt % tungsten;
from 2.0 to about 2.5 wt % molybdenum;
from 3.5 to about 4 wt % rhenium;
from 9 to about 12 wt % cobalt;
from about 0.2 to about 0.6 wt % hafnium;
from about 0.01 to about 0.03 wt % carbon;
from about 0.002 to about 0.006 wt % boron; and
balance nickel and incidental impurities,
wherein the composition exhibits a sustained peak low cycle fatigue life at 1800° F./45 ksi of at least 4000 cycles.

18. The composition of matter of claim 16, wherein the composition of matter consists of:
from about 5 to about 7 wt % aluminum;
from about 6.5 to about 8 wt % tantalum;
about 4.3 wt % chromium;
from about 5 to about 6 wt % tungsten;
from 1.5 to about 2.5 wt % molybdenum;
from 3 to about 4 wt % rhenium;
from 9 to about 12 wt % cobalt;
from about 0.2 to about 0.6 wt % hafnium;
from about 0.01 to about 0.03 wt % carbon;
from about 0.002 to about 0.006 wt % boron; and
balance nickel and incidental impurities,
wherein the composition exhibits a sustained peak low cycle fatigue life at 1800° F./45 ksi of at least 4000 cycles.

19. An article comprising the composition of matter of claim 16.

20. The composition of matter of claim 16, wherein the composition exhibits a sustained peak low cycle fatigue life at 1800° F./45 ksi of at least 5000 cycles.

21. The composition of matter of claim 16, wherein the composition exhibits a rupture life at 2000° F./20 ksi of at least 150 hours.

22. The composition of matter of claim 16, wherein the composition exhibits a rupture life at 2000° F./20 ksi of at least 200 hours.

* * * * *